US010120405B2

(12) United States Patent
Regier

(10) Patent No.: US 10,120,405 B2
(45) Date of Patent: Nov. 6, 2018

(54) SINGLE-JUNCTION VOLTAGE REFERENCE

(71) Applicant: NATIONAL INSTRUMENTS CORPORATION, Austin, TX (US)

(72) Inventor: Christopher G. Regier, Cedar Park, TX (US)

(73) Assignee: NATIONAL INSTRUMENTS CORPORATION, Austin, TX (US)

( * ) Notice: Subject to any disclaimer, the term of this patent is extended or adjusted under 35 U.S.C. 154(b) by 1252 days.

(21) Appl. No.: 14/245,693

(22) Filed: Apr. 4, 2014

(65) Prior Publication Data

US 2015/0286239 A1 Oct. 8, 2015

(51) Int. Cl.
*H01L 29/66* (2006.01)
*G05F 3/16* (2006.01)

(52) U.S. Cl.
CPC ..................................... *G05F 3/16* (2013.01)

(58) Field of Classification Search
CPC ........................................................ G05F 3/16
USPC ........................................ 257/175, 426, 469
See application file for complete search history.

(56) References Cited

U.S. PATENT DOCUMENTS 4,562,400 A 12/1985 Narasimhan
4,668,903 A * 5/1987 Elbert .................... G05F 1/567 323/231
4,769,589 A 9/1988 Rosenthal
5,053,640 A * 10/1991 Yum ........................ G05F 3/30 323/313
5,434,533 A 7/1995 Furutani
5,631,551 A * 5/1997 Scaccianoce ............ G05F 3/30 323/281
5,640,085 A * 6/1997 Petr ........................ G01R 19/32 324/105
5,838,192 A 11/1998 Bowers
5,973,550 A 10/1999 Bowers
6,111,397 A 8/2000 Leung
6,184,661 B1 * 2/2001 Becker ...................... H02P 9/30 322/25
6,222,470 B1 * 4/2001 Schuelke .................. G05F 3/30 327/513
6,342,780 B1 1/2002 Pickering
6,483,372 B1 * 11/2002 Bowers .................. G05F 3/265 327/512

(Continued)

*Primary Examiner* — Viet Q Nguyen
(74) *Attorney, Agent, or Firm* — Meyertons Hood Kivlin Kowert & Goetzel, P.C.; Jeffrey C. Hood

(57) ABSTRACT

A single semiconductor-based junction may be used to create a voltage reference, and temperature compensate the voltage reference, by time-multiplexing the voltage reference between different current drive levels. That is, the value of the current driven through the single junction may be repeatedly varied in a recurring manner. In case the junction is a zener diode, the current may be repeatedly switched between forward and reverse directions. As long as the temperature coefficients (in ppm/° C.) of the different voltages developed responsive to the different currents across the junction are different, a weighting of the different voltage values yield a zero temperature coefficient voltage reference value. To implement a bandgap reference, a single diode-connected bipolar junction transistor may alternately be forward-biased using a first current and at least a second current. A weighting of the (at least) two resulting Vbe (base-emitter voltage) drops may yield a zero temperature coefficient bandgap voltage.

18 Claims, 5 Drawing Sheets

(56) References Cited

U.S. PATENT DOCUMENTS 6,512,412 B2 1/2003 Casper
6,650,170 B1 * 11/2003 Uzelac ................ H01L 27/0629 257/E27.016
6,987,416 B2 1/2006 Ker
7,108,420 B1 * 9/2006 Schnaitter ................ G01K 7/01 327/539
7,116,588 B2 10/2006 Joo
7,122,997 B1 10/2006 Werking
7,164,308 B2 1/2007 Lee
7,564,298 B2 7/2009 Mun
8,094,033 B2 * 1/2012 Dauphinee ....... G01R 31/31723 324/105
8,350,555 B2 * 1/2013 Kim .......................... G05F 3/24 323/314
8,433,265 B2 * 4/2013 McElwee ................ H03F 1/301 330/272
8,760,180 B1 * 6/2014 King .................. G01R 31/2879 324/105
9,218,016 B2 * 12/2015 Pan ........................... G05F 1/10
9,329,614 B1 * 5/2016 Drakshapalli ............. G05F 3/02
9,726,696 B2 * 8/2017 Powell ............... G01R 19/0069
2003/0025551 A1 * 2/2003 Kobayashi .............. G05F 1/565 327/540
2006/0202772 A1 * 9/2006 Ishikawa .................. H03B 5/04 331/176
2009/0146719 A1 * 6/2009 Pernia ...................... H03B 5/04 327/291
2009/0146748 A1 * 6/2009 Pernia ...................... H03B 5/04 331/109
2011/0068854 A1 * 3/2011 Engl ......................... G05F 3/30 327/512
2011/0080153 A1 * 4/2011 Metzger .................... G05F 3/20 323/311
2012/0250721 A1 * 10/2012 Wang ....................... G01K 7/00 374/1
2014/0009221 A1 * 1/2014 Motz .................. G01R 33/0029 327/564
2014/0084899 A1 * 3/2014 Powell ..................... G01K 7/01 323/313
2014/0145701 A1 * 5/2014 Temkine ................... G05F 3/30 323/314
2014/0168041 A1 * 6/2014 Chen .................... G09G 3/3696 345/87
2015/0214903 A1 * 7/2015 Zhang ..................... H03F 1/301 330/291

* cited by examiner

SINGLE-JUNCTION VOLTAGE REFERENCE

FIELD OF THE INVENTION

The present invention relates generally to voltage references, and more particularly to a stable single junction voltage reference.

DESCRIPTION OF THE RELATED ART

Measurement systems are often used to perform a variety of functions, including measurement of a physical phenomenon, a unit under test (UUT) or device under test (DUT), test and analysis of physical phenomena, process monitoring and control, control of mechanical or electrical machinery, data logging, laboratory research, and analytical chemistry, to name a few examples. A measurement system may typically include transducers, sensors, or other detecting means for providing "field" electrical signals representing a process, physical phenomena, equipment being monitored or measured, etc. The field signals are provided to the measurement hardware. In addition, a measurement system may also typically include actuators for generating output signals for stimulating a DUT.

PC-based measurement and data acquisition (DAQ) systems and plug-in boards are used in a wide range of applications in the laboratory, in the field, and on the manufacturing plant floor, among others. Typically, in a measurement or data acquisition process, analog signals are received by a digitizer, which may reside in a DAQ device or instrumentation device. The analog signals may be received from a sensor, converted to digital data (possibly after being conditioned) by an Analog-to-Digital Converter (ADC), and transmitted to a computer system for storage and/or analysis. Then, the computer system may generate digital signals that are provided to one or more digital to analog converters (DACs) in the DAQ device. The DACs may convert the digital signal to an output analog signal that is used, e.g., to stimulate a DUT.

DAQ devices may also include a Source-Measure Unit (SMU), which may apply a voltage to a DUT and measure the resulting current, or may apply a current to the DUT and measure the resulting voltage. SMUs typically cover a variety of signal levels, from the microvolt (μV) range to the kilovolt (kV) range, and from the femtoampere (fA) range to the ampere (A) range. SMUs, as well as any other device that sources or measures voltage generally contains an internally defined reference of what "1V", i.e 1 Volt is. The circuit component that performs this function is referred to as a voltage reference, which preferably remains constant over varying temperature, time, and other environmental changes. Referring again to SMUs, or any circuitry tasked with measurement/sourcing voltages and/or currents, the long-term accuracy of the unit/circuitry may be ensured by relying on self-calibration, which may remove stability requirements for most of the circuitry, and instead of the majority of circuitry requiring strict stability, self-calibration allow for requiring only a small number of components to meet strict stability requirements. For example, instead of requiring an entire voltage measurement path to be stable over a long-term, only a single voltage reference (also referred to herein as a reference voltage) may be expected to remain stable. The value of the voltage reference is therefore determined during the calibration process, and, for digital systems, the value is stored onboard, typically in some sort of nonvolatile memory.

The least expensive voltage reference is a simple zener diode. Unfortunately, zener diodes generally have very undesirable temperature coefficients, and applications requiring more than minimal precision have to therefore incorporate an integrated solution that contains temperature-compensating components. Such a solution usually takes the form of a small IC (integrated circuit), although some ICs also require additional components and/or circuitry to provide full functionality. The highest precision voltage references are quite expensive. Furthermore, IC-based references tend to provide a more noisy signal than properly-biased zener diodes, because they are based on small junction semiconductors. Multiple circuit-configurations exist for generating temperature-stable voltages in voltage-reference ICs. In one set of circuit-configurations, temperature drift in one part of the circuit is used to cancel temperature drift in another part of the circuit. For such a circuit to operate properly, the entire circuit has to be operating at the same temperature, making it difficult to implement such a design off-chip at the board level.

Pursuant to the above, the most basic integrated voltage reference is a temperature-compensated zener diode. A simple configuration using zener diodes includes adding one or more forward-biased junctions in series with a reverse-biased zener junction (technically, an avalanche junction) as shown in FIG. 2 and FIG. 3. Illustrating one principle of temperature compensation, FIG. 2 shows a forward-biased PN junction 202 coupled to reverse-biased zener junction 204, with corresponding respective voltage diagrams 206 and 208 illustrating the voltage change with variation in temperature. Voltage diagrams 206 and 208 both illustrate the voltage change across the junction 202 and junction 204, respectively, when a current of 7.5 mA is flowing through the junctions as the temperature varies from 25° C. to 100° C. As illustrated by diagrams 206 and 208, the respective temperature coefficients of the voltage across junction 202 and the voltage across junction 204 have different ppm/° C. (parts-per-million/° C.) values, and yield a stable reference voltage between terminals 212 and 214. In FIG. 3, multiple (e.g. two) silicon junction diodes 302 and 304 are coupled in series with reverse-biased zener diode 306. Zener diodes may be compensated in many different ways, including thermally stabilizing the diode by regulating the temperature of an on-chip temperature sensor.

Another type of integrated voltage reference is called a bandgap reference. A bandgap reference operates on the basis that a pair of BJTs (bipolar junction transistors) operating at different collector current densities have different $V_{be}$ (base-emitter voltage) temperature coefficients. Adding the voltages of the two junctions in the proper proportion yields a voltage that is largely temperature independent. Bandgap voltage references are generally noisier and less stable than well-designed zener-based voltage references.

In general, existing solutions are too costly and don't always provide the required performance. Choices vary between inexpensive voltage references offering a poor performance and highly priced voltage references providing good performance. However, even the best commercially available voltage references consume a lot of power for heating, have noisy outputs, and are sensitive to their external support circuitry, making it quite expensive to obtain the best possible specification. It is therefore desirable to provide a high-performance yet inexpensive board-level voltage-reference solution.

Other corresponding issues related to the prior art will become apparent to one skilled in the art after comparing such prior art with the present invention as described herein.

SUMMARY OF THE INVENTION

In various embodiments of a voltage reference, a single semiconductor-based junction (also referred to as a single semiconductor junction or single-junction) may be used to both create the voltage reference and temperature compensate that voltage reference. The single junction may be in a zener diode, or it may be obtained by diode-connecting a bipolar junction transistor, for example. The creation and compensation of the voltage reference may be accomplished by time-multiplexing the voltage reference between different current drive levels. That is, the value of the current driven through the single junction device (which is providing the voltage reference) may be repeatedly varied in a recurring manner. In one set of embodiments, in order to implement a temperature compensated zener diode, the current through the zener diode may be repeatedly switched between forward and reverse directions. Furthermore, the current may also be repeatedly switched between different forward or reverse current values, as desired. As long as the temperature coefficients (in ppm/° C.) of the forward voltage(s) and the reverse voltage(s) across the junction are different, a weighting of the different voltage values can yield a zero temperature coefficient (TC) reference voltage value.

To implement a bandgap reference, a single diode-connected BJT may be forward-biased with at least two alternating currents having different values. In other words, the single diode-connected BJT may alternately be forward-biased using a first current (having a first value) and at least a second current (having a second value). Again, a weighting of the (at least) two resulting $V_{be}$ (base-emitter voltage) drops may yield a zero TC reference voltage value.

Therefore, a temperature compensated voltage reference may be implemented using a single semiconductor junction (SSJ) and circuitry coupled to the SSJ to obtain a temperature compensated voltage value of the voltage reference based on voltages developed across the SSJ. Accordingly, the circuitry may be operated to obtain a set of voltage values by alternately applying a first current then a second current to the SSJ one or more times. Applying the first current results in a first voltage developed across the SSJ, and applying the second current results in a second voltage developed across the SSJ. The set of voltage values will thereby include one or more first voltage values and one or more second voltage values, where each first voltage value of the one or more first voltage values is representative of the first voltage for a corresponding application of the first current to the SSJ, and each second voltage value of the one or more second voltage values is representative of the second voltage for a corresponding application of the second current to the SSJ. The circuitry may vary the temperature of the SSJ over a temperature range during the course of obtaining the set of voltage values, to track the voltage change with respect to temperature.

The temperature range may vary from embodiment to embodiment, or it may even vary between different operating times of a same embodiment. Overall, the actual value of the temperature range may be of importance only when targeting a specific nonzero temperature coefficient, otherwise as long as the temperature is changing, the value of the temperature range itself may not be of importance. The circuitry may then determine one or more parameters based on the one or more first voltage values and the one or more second voltage values. The one or more parameters are parameters of a function of the first voltage and the second voltage whereby the function yields a temperature compensated voltage value of the voltage reference. The one or more parameters may then be stored by the circuitry and later used to provide a temperature compensated reference voltage value and/or corresponding reference voltage signal.

The temperature of the SSJ may vary on its own as a result of alternately applying the first current and the second current, or the circuitry may be operated to apply heat to the SSJ via a heating device. In some embodiments, heating the SSJ may include periodically applying a third current (without measuring the voltage) for a specified period when neither the first current nor the second current is applied. The circuitry may then determine a temperature compensated voltage value of the voltage reference during operation by alternately applying—one or more times—the first current to the SSJ and the second current to the SSJ, measuring the first voltage for each application of the first current and measuring the second voltage for each application of the second current, and obtaining the temperature compensated voltage value of the voltage reference according to the function, using the previously stored one or more parameters and the measurement results from the measurements of the first voltage and the second voltage. Again, multiple voltage readings may be obtained (as also described above), using the corresponding voltage values for the first voltage and second voltage, respectively. In some embodiments the function may be a weighting function, and the one or more parameters may be weighting coefficients respectively corresponding to the first voltage and the second voltage. In such embodiments, the temperature compensated voltage reference value may be obtained by weighting the first voltage value (or averaged first voltage values) by the first weighting coefficient, weighting the second voltage value (or averaged second voltage values) by the second weighting coefficient, and summing together the two weighted voltage values.

In some embodiments, in order to obtain the set of voltage values, the circuitry may further alternately apply one or more additional currents to the SSJ to obtain one or more additional voltage values, with each of the one or more additional voltage values representative of a respective voltage developed across the SSJ responsive to a corresponding current of the one or more additional currents applied to the SSJ. In these embodiments, the function is a function of the one or more respective voltages and the first voltage and the second voltage. In other words, the circuitry may alternately apply the first current, second current, and the one or more additional currents to the SSJ to obtain one or more first voltage values, one or more second voltage values, and one or more additional voltage values as described above. The circuitry may then determine one or more additional parameters of the function, based on the one or more additional voltage values. In such a case, the temperature compensated voltage reference value may be determined by the function according to the one or more parameters, the one or more additional parameters, the first and second voltage values and the one or more additional voltage values. In embodiments where the function is a weighting function, the one or more additional parameters may be additional respective weighting coefficients corresponding to the one or more additional voltage values, and the temperature compensated voltage value of the reference voltage may be obtained by weighting each respective voltage value (corresponding to a respective one of the alternately applied currents) with its corresponding weighting coefficient, and summing all the weighted voltage values together.

According to some embodiments, a measurement system may include a functional unit, a reference control unit, and a single SSJ coupled to the reference control unit for establishing a reference voltage value. In addition, the SSJ may also be selectively coupled to the functional unit for measuring the voltage developed across the SSJ. The reference control unit may be operated to apply, one or more times, a first current and a second current to the SSJ to develop a first voltage and a second voltage across the SSJ, respectively. The functional unit may be operated to measure the first voltage for each application of the first current, and measure the second voltage for each application of the second current. The functional unit may then determine a temperature compensated voltage value of a reference voltage corresponding to the SSJ according to a function of the first voltage and the second voltage, using the results of the voltage measurements and previously stored one or more parameters of the function respectively corresponding to the first voltage and the second voltage, and obtained as described above. By using the one or more parameters and the results of the voltage measurements, the function yields the temperature compensated voltage value of the reference voltage. In addition, the measurement system may include supporting circuitry to provide a reference voltage signal according to the temperature compensated voltage value.

BRIEF DESCRIPTION OF THE DRAWINGS

A better understanding of the present invention can be obtained when the following detailed description of the preferred embodiment is considered in conjunction with the following drawings, in which.

Figure 1:
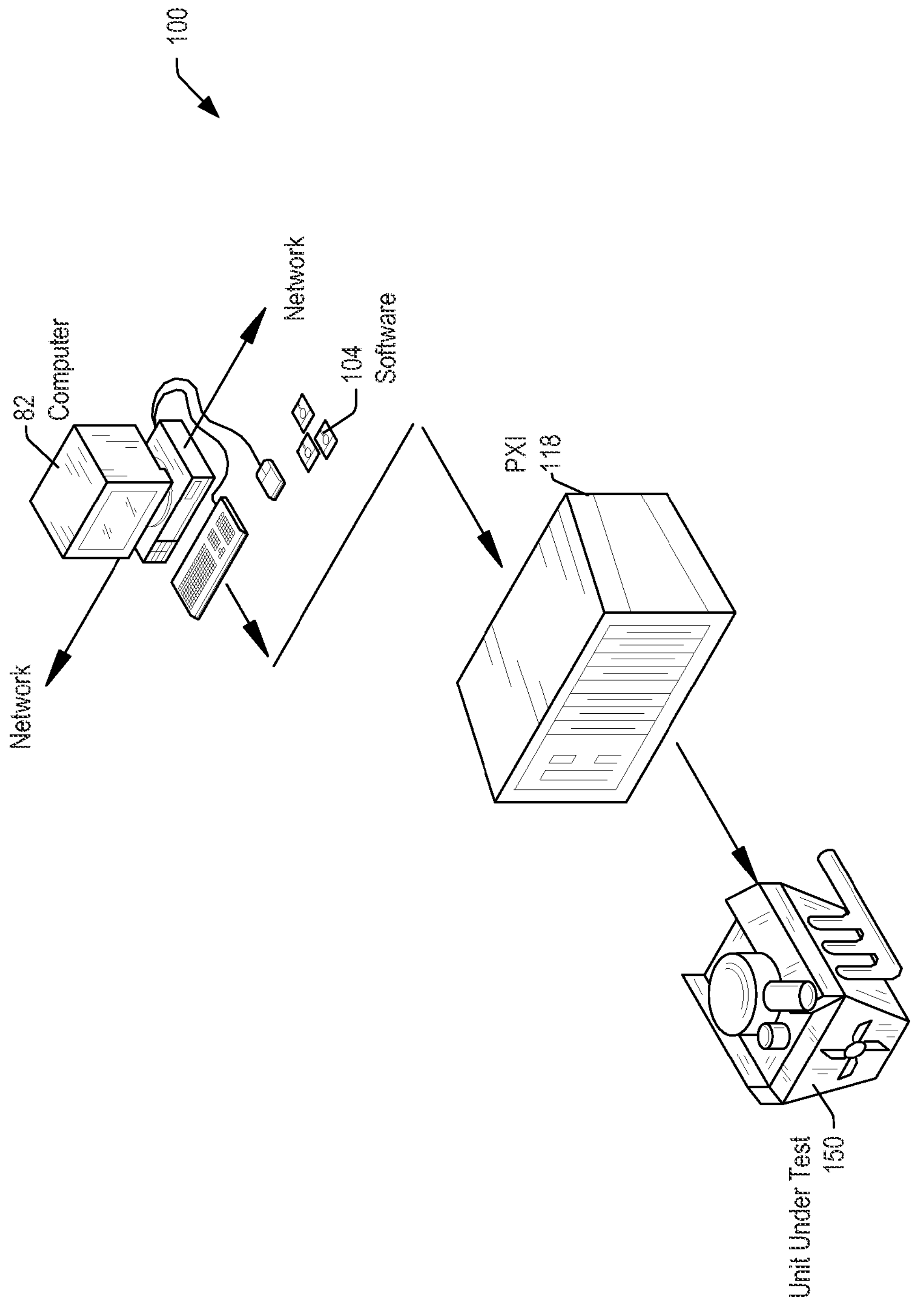
FIG. 1 illustrates an instrumentation system according to one embodiment of the invention.
Figure 2:
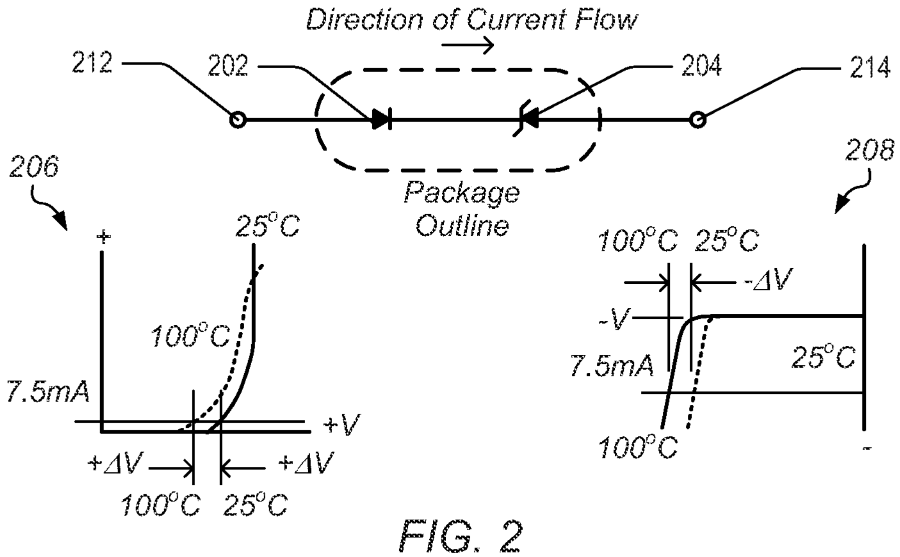
FIG. 2 (Prior Art)
FIG. 2 is a circuit diagram illustrating one example of a temperature compensated voltage reference using a zener diode, according to prior art.
Figure 3:
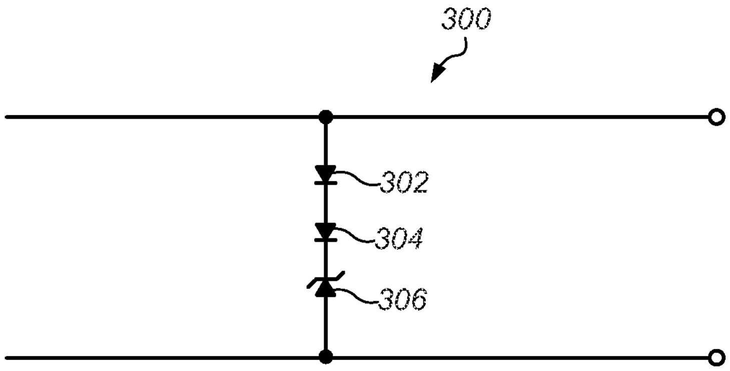
FIG. 3 (Prior Art)
FIG. 3 is a circuit diagram illustrating one example of a temperature compensated voltage reference using a zener diode and multiple silicon junction diodes, according to prior art.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

The following is a glossary of various terms used in the present application:

Memory Medium—Any of various types of non-transitory computer accessible memory devices or storage devices. The term "memory medium" is intended to include an installation medium, e.g., a CD-ROM, floppy disks 104, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. The memory medium may comprise other types of non-transitory memory as well or combinations thereof. In addition, the memory medium may be located in a first computer in which the programs are executed, or may be located in a second different computer which connects to the first computer over a network, such as the Internet. In the latter instance, the second computer may provide program instructions to the first computer for execution. The term "memory medium" may include two or more memory mediums which may reside in different locations, e.g., in different computers that are connected over a network.

Carrier Medium—a memory medium as described above, as well as a physical transmission medium, such as a bus, network, and/or other physical transmission medium that conveys signals such as electrical, electromagnetic, or digital signals.

Programmable Hardware Element—includes various hardware devices comprising multiple programmable function blocks connected via a programmable interconnect. Examples include FPGAs (Field Programmable Gate Arrays), PLDs (Programmable Logic Devices), FPOAs (Field Programmable Object Arrays), and CPLDs (Complex PLDs). The programmable function blocks may range from fine grained (combinatorial logic or look up tables) to coarse grained (arithmetic logic units or processor cores). A programmable hardware element may also be referred to as "reconfigurable logic".

Software Program—the term "software program" is intended to have the full breadth of its ordinary meaning, and includes any type of program instructions, code, script and/or data, or combinations thereof, that may be stored in a memory medium and executed by a processor. Exemplary software programs include programs written in text-based programming languages, such as C, C++, PASCAL, FORTRAN, COBOL, JAVA, assembly language, etc.; graphical programs (programs written in graphical programming languages); assembly language programs; programs that have been compiled to machine language; scripts; and other types of executable software. A software program may comprise two or more software programs that interoperate in some manner. Note that various embodiments described herein may be implemented by a computer or software program. A software program may be stored as program instructions on a memory medium.

Hardware Configuration Program—a program, e.g., a netlist or bit file, that can be used to program or configure a programmable hardware element.

Program—the term "program" is intended to have the full breadth of its ordinary meaning. The term "program" includes 1) a software program which may be stored in a memory and is executable by a processor or 2) a hardware configuration program useable for configuring a programmable hardware element.

Computer System—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" can be broadly defined to encompass any device (or combination of devices) having at least one processor that executes instructions from a memory medium.

Measurement Device—includes instruments, data acquisition devices, smart sensors, and any of various types of devices that are configured to acquire and/or store data. A measurement device may also optionally be further configured to analyze or process the acquired or stored data. Examples of a measurement device include an instrument, such as a traditional stand-alone "box" instrument, a computer-based instrument (instrument on a card) or external instrument, a data acquisition card, a device external to a computer that operates similarly to a data acquisition card, a smart sensor, one or more DAQ or measurement cards or modules in a chassis, an image acquisition device, such as an image acquisition (or machine vision) card (also called a video capture board) or smart camera, a motion control device, a robot having machine vision, and other similar types of devices. Exemplary "stand-alone" instruments include oscilloscopes, multimeters, signal analyzers, arbitrary waveform generators, spectroscopes, and similar measurement, test, or automation instruments.

A measurement device may be further configured to perform control functions, e.g., in response to analysis of the acquired or stored data. For example, the measurement device may send a control signal to an external system, such as a motion control system or to a sensor, in response to particular data. A measurement device may also be configured to perform automation functions, i.e., may receive and analyze data, and issue automation control signals in response.

Functional Unit (or Processing Element)—refers to various elements or combinations of elements. Processing elements include, for example, circuits such as an ASIC (Application Specific Integrated Circuit), portions or circuits of individual processor cores, entire processor cores, individual processors, programmable hardware devices such as a field programmable gate array (FPGA), and/or larger portions of systems that include multiple processors, as well as any combinations thereof.

Automatically—refers to an action or operation performed by a computer system (e.g., software executed by the computer system) or device (e.g., circuitry, programmable hardware elements, ASICs, etc.), without user input directly specifying or performing the action or operation. Thus the term "automatically" is in contrast to an operation being manually performed or specified by the user, where the user provides input to directly perform the operation. An automatic procedure may be initiated by input provided by the user, but the subsequent actions that are performed "automatically" are not specified by the user, i.e., are not performed "manually", where the user specifies each action to perform. For example, a user filling out an electronic form by selecting each field and providing input specifying information (e.g., by typing information, selecting check boxes, radio selections, etc.) is filling out the form manually, even though the computer system must update the form in response to the user actions. The form may be automatically filled out by the computer system where the computer system (e.g., software executing on the computer system) analyzes the fields of the form and fills in the form without any user input specifying the answers to the fields. As indicated above, the user may invoke the automatic filling of the form, but is not involved in the actual filling of the form (e.g., the user is not manually specifying answers to fields but rather they are being automatically completed). The present specification provides various examples of operations being automatically performed in response to actions the user has taken.

Concurrent—refers to parallel execution or performance, where tasks, processes, or programs are performed in an at least partially overlapping manner. For example, concurrency may be implemented using "strong" or strict parallelism, where tasks are performed (at least partially) in parallel on respective computational elements, or using "weak parallelism", where the tasks are performed in an interleaved manner, e.g., by time multiplexing of execution threads.

FIG. 1 illustrates an exemplary instrumentation system 100 configured with embodiments of the present invention. Embodiments of the present invention may be involved with performing test and/or measurement functions; controlling and/or modeling instrumentation or industrial automation hardware; modeling and simulation functions, e.g., modeling or simulating a device or product being developed or tested, etc. However, it is noted that embodiments of the present invention can be used for a variety of applications that benefit from the use of a voltage reference, and is not limited to the above applications. In other words, applications discussed in the present description are exemplary only, and embodiments of the present invention may be used in any of various types of systems.

As shown in FIG. 1, the system 100 may include a host computer 82. The host computer 82 may be coupled to a network and include a display device and at least one memory medium on which one or more computer programs or software components, according to one embodiment of the present invention may be stored. For example, the memory medium may store one or more graphical programs which are executable to perform the methods described herein. Additionally, the memory medium may store a graphical programming development environment application used to create and/or execute such graphical programs. The memory medium may also store operating system software, as well as other software for operation of the computer system. Various embodiments further include receiving or storing instructions and/or data implemented in accordance with the foregoing description upon a carrier medium.

Further, the host computer 82 may include a central processing unit (CPU) and one or more input devices such as a mouse or keyboard as shown. The computer 82 may operate with the one or more instruments to analyze, measure or control a unit under test (UUT) 150, e.g., via execution of software 104.

The one or more instruments may include PXI instrument 118. PXI instrument 118 may include one or more single junction voltage references according to various embodiments presented herein. PXI instrument 118 may also include a source-measure unit (SMU) and/or other types of circuitry or components that may operate according to the voltage reference(s), and which may also self-calibrate and may be used to temperature compensate the voltage reference. Alternatively, the voltage reference and the circuitry/components making use of the voltage reference may be included in another type of chassis or may be a stand-alone, or independent, device. The computer system may couple to and operate with PXI instrument 118. PXI instrument 118 may be coupled to the UUT 150. The system 100 may be used in a data acquisition and control application or in a test and measurement application, among others. Additionally, PXI instrument 118 may couple to host computer 82 over a network, such as the Internet.

System 100 is provided by way of example as one possible system in which one or more embodiments of a single junction voltage reference may be used. However, any system or device that may require or benefit from a voltage reference may include embodiments of the single junction voltage reference disclosed herein, and use of such voltage references is not restricted to system 100 shown in FIG. 1.

Figure 4:
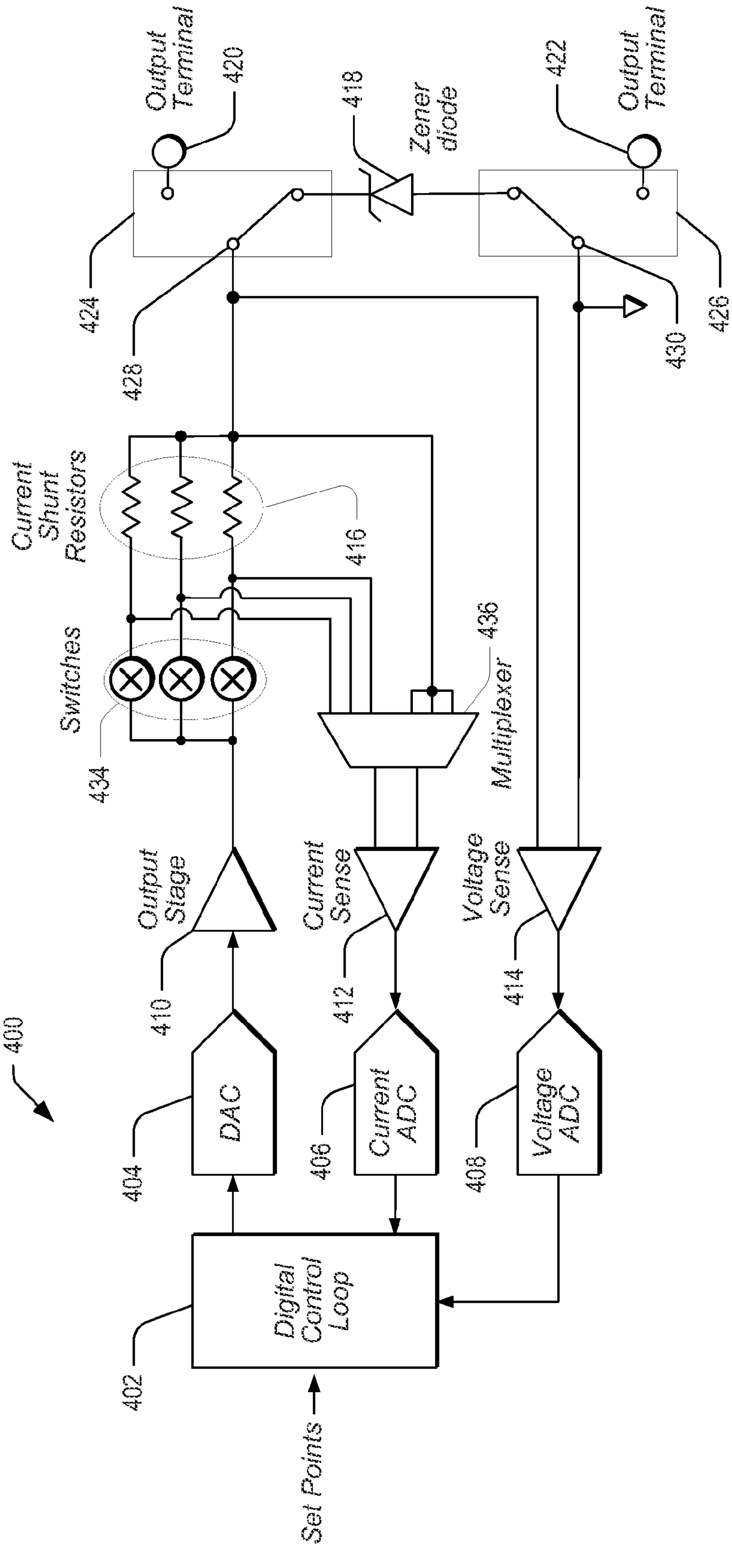
FIG. 4 is circuit diagram of a measurement device with a single junction voltage reference according to a first embodiment.

FIG. 4 is a block diagram of an exemplary system using a single junction to provide a voltage reference and temperature compensate the voltage reference according to one embodiment. FIG. 4 shows the basic architecture of one embodiment of an SMU 400 in which the entire control loop has been configured in the digital domain. SMU 400 is shown by way of example, as one possible control system which may be used with as single junction (e.g. zener diode 418) to implement a stable reference voltage. Those of ordinary skill in the art will appreciate that SMU 400 may be replaced with other devices and/or systems implementing the voltage reference as will be further described below. However, for ease of illustration, one embodiment of an SMU (400) well suited for implementing the single junction voltage reference is provided herein. A device under test (DUT), not shown, may be coupled between output terminals 420 and 422. A Digital Control Loop (DCL) 402 may provide a control output through DAC (digital-to-analog converter) 404 to Output Stage 410. Feedback from Output Stage 410 may be provided to Current ADC (analog-to-digital converter) 406 and Voltage ADC 408 via respective Current Sense element 412 and Voltage Sense element 414. As shown, different current shunt resistors 416 may be switched into the feedback loop between the output of Output Stage 410 and the inputs of Current Sense element 412, using a multiplexer 436 and a set of switches 434, but alternate embodiments may be configured with a greater or lesser number of switches and/or resistors, as desired. Shunt switching may provide the SMU with the capability to cover a wider dynamic range of current. Any errors in the calculations may eventually be corrected by DCL 402. Thus, Current ADC 406 and Voltage ADC 408 may then provide the readback current and voltage values into DCL 402. Additionally, to implement the stable voltage reference, a single junction, exemplified in FIG. 4 as a zener diode 418 may be selectively switched into the circuit in place of the output terminals 420 and 422, when desired.

Furthermore, DCL 402 may include a functional unit. As used herein, the term functional unit refers to various elements or combinations of elements. Processing elements include, for example, circuits such as an ASIC (Application Specific Integrated Circuit), portions or circuits of individual processor cores, entire processor cores, individual processors, programmable hardware devices such as a field programmable gate array (FPGA), and/or larger portions of systems that include multiple processors, as well as any combinations thereof. In one embodiment, the functional unit may be configured to perform the methods further described below. In certain embodiments, a memory medium may store the methods described below for execution on one or more processing units, such as the functional unit that may be included in DCL 402.

Thus, in certain embodiments, the functional unit may be operated to time-multiplex between different current drive levels provided to zener diode 418. More generally, the functional unit may be operated to time-multiplex between different current drive levels provided to a single junction coupled across terminals 428 and 430. Accordingly, the value of the current driven through zener diode 418 (which is providing the voltage reference) may be repeatedly varied in a recurring manner. It should be noted that in alternate embodiments, a separate reference control block may be used to drive the varying currents through zener diode 418, as will be further discussed with respect to FIG. 5. In one embodiment, in order to temperature compensate zener diode 418, the current through the zener diode may be repeatedly switched between at least one forward current and one reverse current. Furthermore, the current through zener diode 418 may in addition be repeatedly switched between different forward or reverse current values as well, alternately driving three or more different currents through zener diode 418 overall. As long as at least two of the temperature coefficients (in ppm/° C.) of the forward voltage(s) and the reverse voltage(s) across the junction are different from each other, a temperature compensated voltage reference value may be obtained from a function (or mathematical expression) of the different corresponding voltage values according to one or more parameters of the function, as will be further described below. In some embodiments, the function may be a weighting function, with the one or more parameters representing weighting coefficients respectively associated with the different corresponding voltage values. In such embodiments, the corresponding voltage values may be weighted with the weighting coefficients to obtain the zero temperature coefficient (TC) voltage reference.

Furthermore, the single junction is by no means limited to zener diode 418. For example, in order to implement a bandgap reference, a single diode or diode-connected BJT (DBJT, not shown) may be used in lieu of zener diode 418, and the functional unit (within DCL 402) may be operated to alternately forward-bias the diode/DBJT with at least two currents having different values. That is, the single diode/DBJT may be alternately forward-biased using a first current (having a first value) and at least a second current (having a second value). Again, a weighting of the (at least) two resulting $V_{be}$ (base-emitter voltage) drops may yield a zero TC voltage reference when the function is a weighting function.

Figure 5:
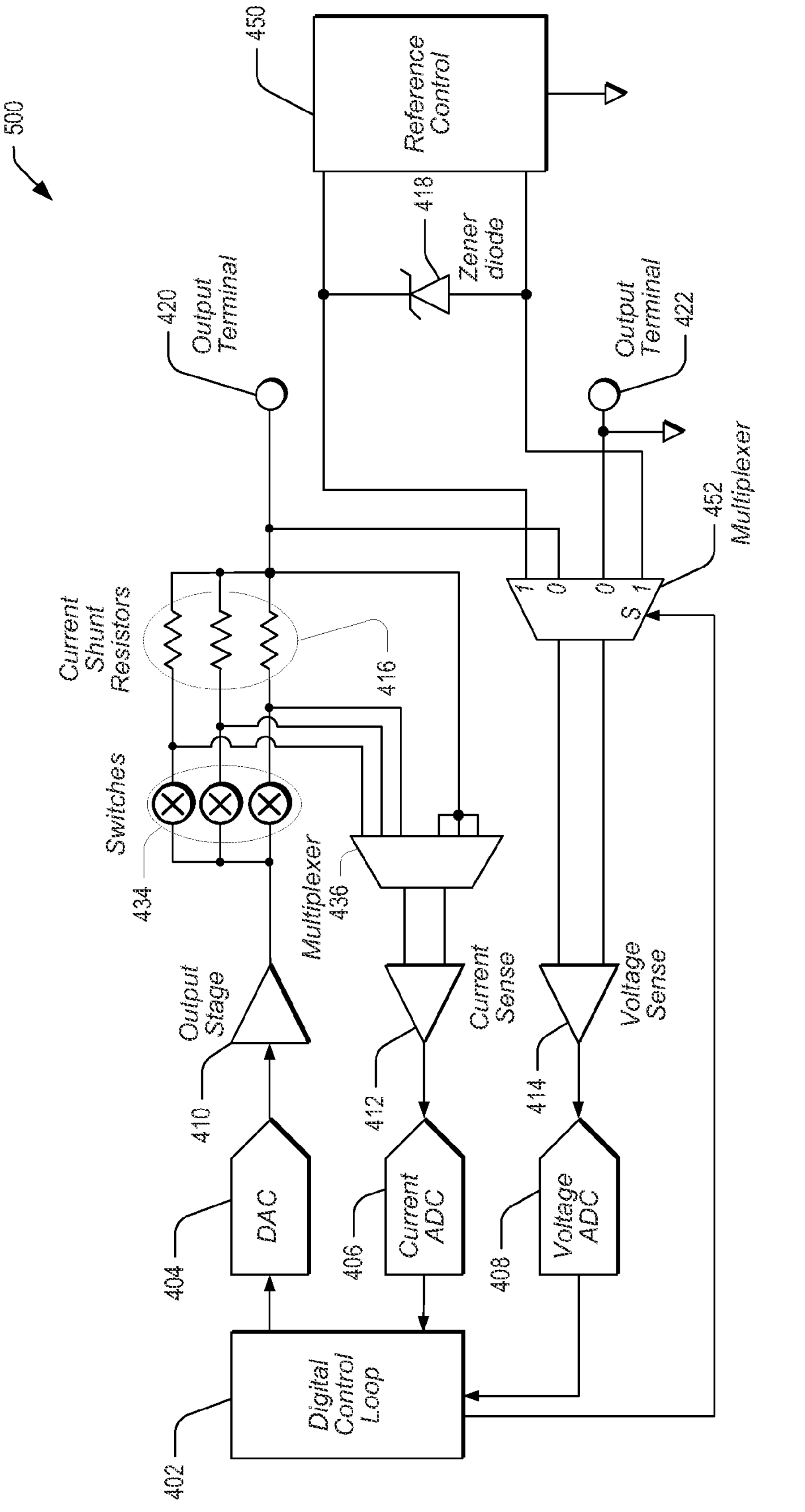
FIG. 5 is circuit diagram of a measurement device with a single junction voltage reference according to a second embodiment.

In one set of embodiments, one or more parameters (e.g. a set of weighting coefficients) of a function/mathematical expression used to calculate the temperature compensated voltage value of the voltage reference (or reference voltage) may be determined, for example during calibration of the system, where the system also includes the single junction, to later compensate for a change in the voltage across the single junction due to variations in temperature. In this manner, the voltage across the junction may be used as a stable reference voltage in the system. It should be noted again that while FIG. 4 shows one possible implementation of a control structure to provide management of the voltage reference, other embodiments (e.g. as shown in FIG. 5) may use different circuitry that may be well suited and operated to perform the same operations as will be further detailed below.

In order to determine the one or more parameters (e.g. weighting coefficients) for temperature compensating the value of the reference voltage provided by the single-junction, e.g. zener diode 418, a control system (or functional unit) may alternate driving at least two different currents through zener diode 418. One of the currents, or a first current, may be a reverse current flowing from terminal 428 to terminal 430, resulting in the zener diode breakdown voltage across the terminals of zener diode 418. A second current may be a forward current flowing from terminal 430 to terminal 428, resulting in a second voltage (drop) across zener diode 418. Similarly, a different third current may be driven across zener diode 418 from terminal 430 to terminal 428, or as many additional different currents as desired. Once the specified number of different currents has been applied (driven) through zener diode 418, the process may be repeated again for all the different currents. Overall, each different current may be driven through zener diode 418 in succession a specified number of times. For each current (value), a corresponding respective voltage measurement may be taken, thereby obtaining a respective set of one or more voltage values corresponding to each current. While obtaining the sets of one or more voltage values (e.g. while switching back and forth between the different current values), the temperature of the zener diode may also be swept over a specified temperature range.

Alternatively, the temperature of zener diode 418 may simply change as part of the operation of zener diode 418 as the currents are applied. For example, in one embodiment a reverse current having a first value may be applied as the first current, then a forward current having a second value may be applied as the second current, and a forward current having a third value may be applied. Corresponding voltage measurements across zener diode 418 may be taken for each current, and optionally the temperature may be monitored to ensure that there is a change in temperature as subsequent measurements are taken. The measurements for each different current during one measurement cycle may be taken in quick enough succession that the temperature change between those measurements may be considered negligible for the purposes of measuring the voltage for each different current. During a next rotation, the first, second, and third currents may again be applied in succession, with voltage measurements taken. The process may be performed a specified number of times, or for a specified overall temperature range. The function parameters (e.g. weighting coefficients when the function is a weighting function) may be determined based on the measured voltages, in order to minimize the variaton of the function with respect to changes in temperature.

Overall, in order to determine the parameters (e.g. the weighting coefficients), the SSJ may be placed in an environment where the temperature is changing, either because of the biasing of the SSJ itself, or because the temperature is being changed by some other means. The voltage developed across the SSJ responsive to a first current (having a first value) may be changing in a specific manner because of the changing temperature. The same may be true of the voltage(s) developed across the SSJ responsive to other corresponding currents (having different values) being applied to the SSJ. That is, the voltage values may be changing because of the changes in temperature when they would otherwise be expected to remain the same. The parameters may then be determined such that the function of the voltages (where a respective one or more voltage values correspond to a specific applied current value) yields a voltage value that does not change simply because the temperature is changing. For example, in case of a weighting function, weighting coefficients may be determined such the weighted sum of the voltages (each voltage corresponding to a respective current value applied to the SSJ) does not change with temperature.

As previously mentioned, as long as the temperature coefficients (in ppm/° C.; i.e parts-per-million/degrees Celsius) corresponding to the different voltage values are different, the parameters of the function, e.g. weighting coefficients may be calculated such that a zero temperature coefficient reference voltage value may be obtained by applying the coefficients to the (measured) voltage value(s). That is, during operation of the system, different currents may be alternately applied to zener diode 418 as described above, but now each measured voltage corresponding to a different applied current may be weighted with its corresponding previously determined weighting factor to obtain a temperature compensated value of the reference voltage provided by zener diode 418 at any time. By way of illustration, alternately applying three different currents to zener diode 418, in other words, three currents having different values, one current being a reverse current and the other two currents being forward currents, the temperature compensated value of the reference voltage may be expressed by the following equation:

$$Vref=V_z+aV_{f1}+bV_{f2}, \tag{1}$$

Where $V_z$ is the zener breakdown voltage corresponding to the applied reverse current, $V_{f1}$ is the voltage corresponding to the first applied forward current, and $V_{f2}$ is the voltage corresponding to the second applied forward current, with all voltages measured across terminals 428 and 430. Furthermore, "a" and "b" represent the weighting factors that may be obtained as previously described. It should be noted that a weighting factor may also be applied to $V_z$, if desired. Of course alternate embodiments may apply only one forward current and a reverse current, or a reverse current and more than two forward currents, or two or more forward currents and two or more reverse currents as desired. It may also be worth noting again that there may be situations where another mathematical operation might be preferred over a weighted sum. For example, it may turn out that $1/Vref=1/V_z+a/V_f$ (in case one forward current of different value is applied) gives a more effective result over a wider temperature range than $Vref=V_z+aV_f$.

Overall, the function may be used to determine the temperature independent value. In the case of a weighting function, for example, the coefficients may be determined in such a way that the weighted sum is temperature independent. For example if $V_z$ increases 10.12 mV as the temperature increases, and $V_f$ increases 5.78 mV at the same time, then the value of the weighting for $V_f$ may be set to be −10.12/5.78 times the value of the weighting factor for $V_z$. With these weighting factors the weighted sum does not change as temperature changes. So, for example, 1 may be set as the coefficient for $V_z$, and −1.7509 may be set as the coefficient for $V_f$. Alternatively, 5.78 may be set as the coefficient for $V_z$, and −10.18 may be set as the coefficient for $V_f$. The specific values don't really matter as long as the weighted sum doesn't move with temperature. Accordingly, when using the voltage reference during operation, the same (determined and stored) coefficients are used to determine the reference value. In addition, the stored weighted sum may be used during self-calibration. It's worth noting that the actual temperature values do not play a role in determining the voltage reference value, but the relative responses to temperature change do.

Furthermore, when determining the voltage reference during operation, multiple readings may be obtained for each corresponding current. That is, multiple alternating applications of each current may be performed similar to when readings are obtained to determine the one or more parameters. While single readings are possible, the results may likely be too noisy, and multiple readings/measurements may therefore be performed. The respective temperature coefficients of the voltages corresponding to the different applied currents are expected to be different, and are furthermore expected to be different expressed in terms of ppm/° C. If the temperature coefficients were different in terms of V/° C. but were the same in terms of ppm/° C., it may not be possible to obtain a nonzero reference voltage. For example, if the zener voltage is 6V with a temperature coefficient of 1000 ppm/° C. (i.e. 0.1%/° C.), and the forward voltage is −0.7V with the same temperature coefficient (in actuality it would not be the same, it would be negative, but for the purposes of illustration it is assumed to have the same value), the zener breakdown voltage would increase +6 mV for every degree of temperature rise, and the −0.7V zener forward voltage would decrease −700 uV for every degree of temperature rise. Accordingly, a zero temperature coefficient weighting would be $Vref=V_z+6/0.7*V_f$. It is apparent that upon performing the required calculations, Vref=0V, with no variation with temperature. Hence, the temperature coefficients of the two readings are expected to be different in terms of ppm/° C. (or %/° C.) rather than in terms of V/° C.

In summary, to determine the function that yields the temperature compensated voltage reference, multiple currents may be applied and multiple voltages may be measured while the temperature is changing. Based on the measurements, different voltage averages may also be determined, and the change of the measured voltages (or the different voltage averages) with respect to temperature may also be determined. The function parameters may then be specified such that the function yields a constant value. During operation, multiple currents may be applied and multiple voltage measurements may be taken. The function may then be used to calculate the voltage reference value using the previously determined parameters corresponding to the averaged voltages, yielding a temperature stabilized value for the voltage reference. The degree to which the computed value of the voltage reference differs from the previously computed and stored value of the voltage reference, using the same function with the same parameters, is the degree to which the measuring circuit has drifted out of calibration.

In various embodiments, the function parameters (e.g. weighting factors) and resulting reference voltage value determined during calibration may be stored in DCL 402, or in any memory element or register to be used during operation, and may be used (by DCL 402, for example) to calculate the compensated voltage reference value based on measurements taken of the voltages across the single junction (zener diode 418) as described above. In such embodiments a DC voltage is not provided in the traditional sense. That is, the voltage is provided as a digital value for use as a reference in the digital system. Depending on the purpose of the reference, however, that may be sufficient for proper operation. For example, to self-calibrate SMU 400 and/or the SMU in FIG. 5, it may be sufficient to force currents through a single junction (e.g. zener diode 418) and measure the resulting voltages as part of self-calibration. In other embodiments, supporting circuitry may also be included to turn the apparent square wave into a usable voltage reference providing an actual DC voltage.

For the voltage reference described above, the compensating junction is the same as the junction generating the voltage, eliminating concerns about having to mount multiple junctions close together, and the single junction voltage reference may therefore be implemented at the board level. However, if the switching between currents is performed too slowly, the temperature of the junction may change or drift between measurements. Conversely, if the switching between currents is performed too quickly, the signals may not have time to properly settle for accurate measurements. Accordingly, it is preferable to perform switching between the different currents at a specified rate, which may be within a certain range, to yield the best performance. For example, switching between the different currents may be performed at a rate such that the temperature doesn't change by more than one $100^{th}$ of 1° C. between different currents being applied.

It should be mentioned that various embodiments of a single junction voltage reference disclosed herein are not limited to silicon junctions. For example a GaN bandgap reference may be constructed. In addition, because individual reference elements (e.g. zener diodes) have become relatively inexpensive, embodiments of a single junction voltage reference may provide considerable cost savings. For example, procuring a large number of zener diodes and screening them for noise, long-term drift, or other performance parameters may still prove to be considerably less expensive than a high quality IC (integrated circuit) reference even if the (zener diode) yield is very low, e.g. only 1%. The low cost may also lend itself to placing multiple references on a circuit, and algorithmically discarding the outliers. For example, if three zener diodes were placed on an SMU board for self-calibration, the self-calibration algorithm may be used to test all three, and use the median. For example, if a first reference voltage indicates that the board has drifted +25 ppm (parts per million), a second reference voltage indicates the board has drifted +30 ppm, and a third reference voltage indicates the board has drifted −10 ppm, the first reference voltage may be used for self-calibration.

According to what has been described above, embodiments of a single junction voltage reference allow for selecting zener diode voltages and operating currents for best performance (e.g. noise) without having to worry about temperature compensation. While temperature compensated zener diode systems have to operate at a certain current to meet their temperature compensation specifications, the embodiments described herein may include a reference voltage(s) that may be individually temperature compensated during factory calibration, and possibly during each subsequent external calibration. As previously described, this may be accomplished by heating the single junction (e.g. zener diode 418) and observing how the voltages at the different applied currents respond to temperature. During calibration, the measured voltages may be used to determine parameters of a function of the same voltages, such that the function yields a temperature compensated reference voltage value. One example of such a function is a weighting function, whereby the voltage values may be weighted and summed to produce the final reference voltage value for the device and/or system (see eq. 1 above as an example). Furthermore, in case of a weighting function, the weighting may be nonlinear to provide desired temperature independence. The heating may result from applying heat with an external device, or simply from heating phases of the current waveform applied to the device (i.e. the heating produced simply through the application of the current waveform).

It should be noted that a simpler alternative to the previously described weighting method might be to regulate the single junction device to an elevated temperature. For example, a control loop (e.g. in the system of FIG. 4) may regulate a zener diode's forward voltage drop, and the reverse breakdown voltage would then be temperature stabilized. However, this may result in excessive noise if the temperature control loop isn't fast enough and because higher temperature increases noise and accelerates drift, measurement weighting is a preferred approach.

It should also be noted that since the voltage-temperature relationship is in general nonlinear, it may be difficult to calibrate the cold-temperature behavior a single junction device. There is no easy way to cool a device, and extrapolating cold temperature behavior from hot temperatures may be inaccurate. For this situation, it may be desirable to use a thermal control loop to establish a minimum operating temperature for the device, with weighting used at higher temperatures. This makes it unnecessary to map the voltage/temperature relationship at cold temperatures, while also avoiding most of the penalty of heating to an elevated temperature. One possible complication with the factory/external calibration procedure may be the presence of thermal hysteresis in the single junction device used for providing the reference voltage. When subject to temperature changes, package stress may also shift the output voltage. This effect may be reduced by limiting the temperature excursions to which the device is subjected, by maintaining a minimum temperature, for example, or by operating at an elevated regulated temperature. It may also be desirable to select a package that doesn't stress the die.

FIG. 5 shows the block diagram of an alternate embodiment, in which a separate control block drives current through the junction, while a functional unit performs the voltage measurements. Reference control block 450 may contain control circuitry to apply the currents to zener diode 418, and the terminals of zener diode 418 may be multiplexed through multiplexer 452 to DCL 402 for the purpose of measuring the voltage(s) across zener diode 418. In this manner, reference voltage control may not place additional resource requirements on the measurement device, which may obtain the temperature compensated voltage value of the reference voltage derived from zener diode 418 by taking measurements of the voltage and performing the necessary calculations according to the function being used, as previously described. Furthermore, the parameters of the function—as also previously described—may also be determined by having reference control block 450 apply the currents, with DCL 402 performing the measurements. As shown in FIG. 5, DCL 402 may select either output terminals 420 and 422 (which may couple to a device under test, and are indicated by '0') or the terminals of zener diode 418 (indicated by '1') in the voltage measurement path.

Figure 6:
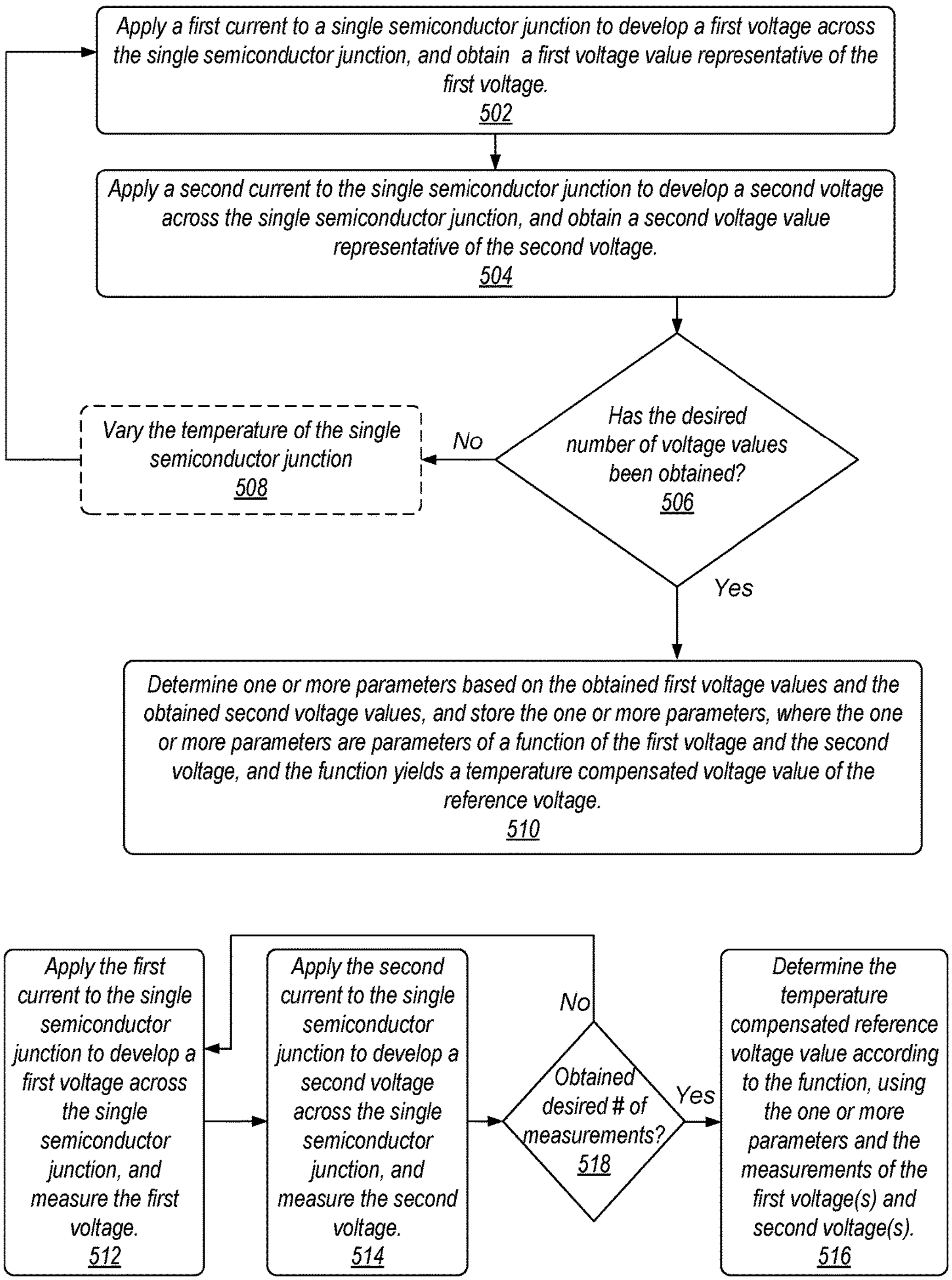
FIG. 6 is a flowchart diagram illustrating one embodiment of a method for determining and providing a stable reference voltage using a single semiconductor junction.

FIG. 6 illustrates a method for calibrating and operating a single junction voltage reference according to one embodiment. The method shown in FIG. 6 may be used in conjunction with any of the computer systems or devices shown in the above Figures, among other devices. Further, a non-transient computer memory medium may be configured to store program instructions executable by one or more functional units to perform the method. In various embodiments, some of the method elements shown may be performed concurrently, in a different order than shown, or may be omitted. Additional method elements may also be performed as desired.

A first current (having a first value) may be applied to a single semiconductor junction (SSJ) to develop a first voltage across the SSJ (502), and a first voltage value representative of the first voltage may be obtained. Similarly, a second current (having a second value different from the first current) may be applied to the SSJ to develop a second voltage value across the SSJ (504), and a second voltage value representative of the second voltage may be obtained. Overall, a set of one or more first voltage values and a set of one or more second voltage values may be obtained by alternately applying the first current and the second current to the SSJ over a specified time period, or a specified number of times, as desired, to obtain a desired number of first voltage measurements and second voltage measurements. As shown in FIG. 6, if the desired number of voltage values has not yet been obtained ('No' branch of 506), then the first current and second current may be applied again, and the corresponding voltage measurements may be obtained. In addition, the temperature of the SSJ may be varied, e.g. after each application of the first and second current (508).

In general, the temperature may be varied over a temperature range spanning the time period during which the desired number of voltage values are obtained. That is, the temperature may be varied such that over the course of all measurements the temperature has been varied over some temperature range. However, the temperature range itself may not be of importance so long as the temperature changes over the time period during which all the voltage measurements are obtained are sufficient to allow for tracking the voltage drift with respect to temperature. The temperature variation of the SSJ may simply result from repeatedly alternately applying the first current and the second current, (hence the dashed line around step 508). In some embodiments, however, varying the temperature of the SSJ may include actually applying heat to the SSJ with a heating device or by other means that are in addition to the currents applied for the purpose of voltage measurements.

Once the desired number of voltage values has been obtained (Yes' branch of 506), one or more parameters may be determined based on the first voltage values and the second voltage values, and the one or more parameters may be stored (510). The parameters are parameters of a function of the first voltage and the second voltage, with the function yielding a temperature compensated voltage value of the reference voltage, which may also be stored. In some embodiments, the function is a weighting function, and step 510 may therefore include determining a first weighting coefficient corresponding to the first current and a second weighting coefficient corresponding to the second current, and those weighting coefficients may be stored.

Based on 502-510, a temperature compensated voltage reference value using the SSJ may then be provided during operation, according to at least the one or more parameters and the function (e.g. according to the first weighting coefficient and the second weighting coefficient, and the weighting function). Specifically, the first current may be applied to the SSJ to develop a first voltage across the SSJ, and the first voltage may be measured (512), and the second current may then be applied to the SSJ to develop a second voltage across the SSJ, and the second voltage may be measured (514), thereby obtaining respective voltage values across the SSJ, corresponding to the first current and the second current. Once the desired number of measurements of first voltage values and second voltage values have been obtained (Yes' branch of 518), the temperature compensated reference voltage value may be determined according to the function, using the one or more parameters and the measurements of the first voltage(s) and second voltage(s) (516). Otherwise the currents may be applied again for additional measurements (No' branch of 518). It should be noted that one goal in determining the desired number of measurements may be to bring uncertainty/noise to within a certain desired target, or, in the case of determining the parameters, to allow sufficient temperature variation to take place. Again, in embodiments where the function is a weighting function, the temperature compensated reference voltage value may be determined by weighting the first voltage value (or average of the measured first voltage values) using the first weighting factor, weighting the second voltage value (or average of the measured second voltage values) using the second weighting factor, and summing the two weighted voltages.

In some embodiments, the method may include applying one or more additional currents to the SSJ to obtain additional respective corresponding voltage values across the SSJ. This may be performed between steps 504 and 506, resulting in a third voltage value from a third current, and/or a fourth voltage value resulting from a fourth current, and so on and so forth. Accordingly, one or more additional sets of respective corresponding voltage values may be obtained and the currents may be alternately applied according to 502, 504, and steps for each additional current (not shown) until all the sets of voltage values have been obtained (506). Accordingly, additional one or more parameters corresponding to the additional respective voltage values may be determined based on the additional respective voltage values. The additional parameters may be stored along with the one or more parameters (as part of 510). In such embodiments, the temperature compensated reference voltage value may be determined by applying each additional current and measuring the voltage developed across the junction (subsequent to 514) until all the currents have been applied and all the respective corresponding voltage values have been measured.

It should also be noted that in case there are more than two different currents applied to the SSJ, it's possible that two of the currents may have the same value. For example, referencing FIG. 4 and FIG. 5, a forward current of 1 mA may be applied to zener diode 418, then a reverse current of 5 mA, and then a 1 mA forward current again, and this process may then be repeated multiple times. In such a case there would be instances where the 1 mA forward current is applied twice in a row as part of the alternating process of applying the two or more currents. One reason for this particular alternating between the currents may be to take the voltage measurements for the forward current on average at the same time as the voltage measurements for the reverse current. If a single forward current and reverse current were alternated, then on average one measurement would take place before the other. In other words, it's one way to obtain "simultaneous" readings on average (of course in real time, measurements would happen in succession, but on average this would amount to taking measurements corresponding to both currents at the same time). While discarding readings or double-counting other readings may also provide a solution to this issue, it may be easier to perform multiple readings for the same current-level. Thus, a variety of combination of currents may be applied so long as at least two of the applied currents have different values. Finally, it should also be mentioned that while previously not explicitly disclosed, a known voltage may be applied to the measurement system to calibrate the temperature-compensated reference, as part of the overall voltage reference calibration process.

It should further be noted that the various terms or designations for circuits/components and signals as they appear herein, for example in such expressions as "driver circuit", "delay circuit", "data signal", "control signal", "first current", "second voltage", "first characteristic", etc. are merely names or identifiers used to distinguish among the different circuits/components and/or between different signals, currents, voltages, etc., and these identifying terms are not intended to connote any specific meaning, unless explicitly noted otherwise.

Although the embodiments above have been described in considerable detail, numerous variations and modifications will become apparent to those skilled in the art once the above disclosure is fully appreciated. It is intended that the following claims be interpreted to embrace all such variations and modifications.

The invention claimed is:

1. A method for implementing a temperature compensated reference voltage using a single semiconductor junction, the method comprising:

obtaining a set of voltage values, comprising obtaining one or more first voltage values and one or more second voltage values, wherein each of the one or more first voltage values is representative of a first voltage developed across a single semiconductor junction (SSJ), and each of the one or more second voltage values is representative of a second voltage developed across the SSJ, said obtaining comprising alternately applying:

a first current to the SSJ to develop the first voltage; and a second current to the SSJ to develop the second voltage;

varying a temperature of the SSJ over a temperature range during said obtaining the set of voltage values; and determining one or more parameters based on the one or more first voltage values and the one or more second voltage values, wherein the one or more parameters are parameters of a function of the first voltage and the second voltage, wherein the function yields a temperature compensated voltage value of a reference voltage derived from the SSJ.

2. The method of claim 1, wherein said varying the temperature of the SSJ comprises one or more of:

the temperature of the SSJ varying responsive to said alternately applying the first current and the second current;

applying heat to the SSJ with a heating device; or applying one or more additional currents for specified periods of time during said obtaining the set of voltage values when not applying the first current and not applying the second current.

3. The method of claim 1, wherein the function is a weighting function, and the one or more parameters are weighting coefficients of the weighting function.

4. The method of claim 1, further comprising providing a temperature compensated reference voltage using the SSJ and according to at least the one or more parameters and the function.

5. The method of claim 4, wherein said providing the temperature compensated reference voltage comprises:

alternately applying one or more times:

the first current to the SSJ; and the second current to the SSJ;

measuring the first voltage for each said applying the first current;

measuring the second voltage for each said applying the second current; and obtaining the temperature compensated voltage value of the reference voltage based on the function, using the one or more parameters, results of said measuring the first voltage, and results of said measuring the second voltage.

6. The method of claim 1, wherein said obtaining the set of voltage values further comprises:

obtaining one or more additional voltage values, comprising alternately applying one or more additional currents to the SSJ, wherein each of the one or more additional voltage values is representative of a respective voltage developed across the SSJ responsive to a corresponding one of the one or more additional currents applied to the SSJ;

the method further comprising:

determining one or more additional parameters of the function, based on the one or more additional voltage values.

7. The method of claim 6, further comprising providing a temperature compensated reference voltage using the SSJ, and according to at least the one or more parameters, the one or more additional parameters, and the function.

8. The method of claim 1, wherein the SSJ is one of:

a zener diode; or a diode-connected bipolar junction transistor.

9. The method of claim 1, wherein the SSJ is a zener diode, the first current is a reverse current, and the first voltage is a zener diode breakdown voltage.

10. The method of claim 9, wherein the function is a weighting function, and the one or more parameters comprise a weighting coefficient corresponding to the zener diode breakdown voltage and having a value of 1.

11. A voltage reference comprising:

a single semiconductor junction (SSJ); and circuitry coupled to the SSJ and configured to:

obtain a set of voltage values, wherein to obtain the set of voltage values, the circuitry is configured to alternately apply one or more times:

a first current to the SSJ to develop a first voltage across the SSJ; and a second current to the SSJ to develop a second voltage across the SSJ;

wherein the set of voltage values comprises one or more first voltage values and one or more second voltage values, wherein each first voltage value of the one or more first voltage values is representative of the first voltage for a respective application of the first current to the SSJ, and each second voltage value of the one or more second voltage values is representative of the second voltage for a respective application of the second current to the SSJ;

vary a temperature of the SSJ over a temperature range during the course of obtaining the set of voltage values; and determine one or more parameters based on the one or more first voltage values and the one or more second voltage values, wherein the one or more parameters are parameters of a function of the first voltage and the second voltage, wherein the function yields a temperature compensated voltage value of the voltage reference.

12. The voltage reference of claim 11, wherein to vary the temperature of the SSJ, the circuitry is configured to perform one or more of:

alternately apply the first current and the second current;

apply heat to the SSJ via a heating device; or apply one or more additional currents for specified periods of time when not applying the first current and not applying the second current while obtaining the set of voltage values.

13. The voltage reference of claim 11, wherein the function is a weighting function, and the one or more parameters are weighting coefficients.

14. The voltage reference of claim 11, wherein the circuitry is configured to determine the temperature compensated voltage value of the voltage reference using the SSJ and according to at least the one or more parameters and the function.

15. The voltage reference of claim 14, wherein to determine the temperature compensated voltage value of the voltage reference, the circuitry is configured to:

alternately apply one or more times:

the first current to the SSJ; and the second current to the SSJ;

measure the first voltage for each application of the first current;

measure the second voltage for each application of the second current; and determine the temperature compensated voltage value of the voltage reference according to the function, using the one or more parameters and results of each measurement of the first voltage and the second voltage.

16. The voltage reference of claim 11, wherein to obtain the set of voltage values, the circuitry is further configured to:

alternately apply one or more additional currents to the SSJ to obtain one or more additional voltage values, wherein each of the one or more additional voltage values is representative of a respective voltage developed across the SSJ responsive to a corresponding one of the one or more additional currents applied to the SSJ; and determine one or more additional parameters of the function, based on the one or more additional voltage values.

17. The voltage reference of claim 16, wherein the circuitry is configured to provide a temperature compensated reference voltage using the SSJ, and according to the function and at least the one or more parameters and the one or more additional parameters.

18. The voltage reference of claim 11, wherein a temperature coefficient corresponding to the first voltage is different from a temperature coefficient corresponding to the second voltage.

* * * * *